United States Patent [19]
Yoshioka et al.

[11] Patent Number: 5,229,634
[45] Date of Patent: Jul. 20, 1993

[54] VERTICAL POWER MOSFET

[75] Inventors: Minoru Yoshioka, Shiki; Mitsuo Matsunami, Tenri; Toshiaki Miyajima, Ikoma; Hideyuki Tsuji, Tenri, all of Japan

[73] Assignee: Sharp Kabushiki Kaishi, Osaka, Japan

[21] Appl. No.: 740,131

[22] Filed: Aug. 5, 1991

[30] Foreign Application Priority Data

Aug. 11, 1990 [JP] Japan .................. 2-212512

[51] Int. Cl.$^5$ .................................. H01L 29/10
[52] U.S. Cl. .................... 257/342; 257/335
[58] Field of Search ............. 357/23.4; 257/139, 337, 257/338, 342, 335

[56] References Cited

U.S. PATENT DOCUMENTS

4,366,495  12/1982  Goodman et al. ............ 357/23
5,053,838  10/1991  Fujihara ....................... 357/23.4

FOREIGN PATENT DOCUMENTS

1-144092   6/1989  Japan .
2-153324   6/1990  Japan .
2-294623  12/1990  Japan .

OTHER PUBLICATIONS

Patent Abstracts of Japan vol. 6, No. 185, Sep. 21, 1982, & JP-A-57100764 (Tokyo Shibaura Denki) Jun. 23, 1982.
Patent Abstracts of Japan vol. 11, No. 171, Jun. 2, 1987; & JP-A-624369 (Toshiba) Jan. 10, 1987.
Patent Abstracts of Japan vol. 12, No. 393, Oct. 19, 1988; & JP-A-63133677 (Matsushita) Jun. 6, 1988.

Primary Examiner—Andrew J. James
Assistant Examiner—Courtney A. Bowers
Attorney, Agent, or Firm—Nixon & Vanderhye

[57] ABSTRACT vertical power MOSFET which comprises a semiconductive substrate of a first conductivity type serving as drain, an impurity region of a second conductivity type on a part of the surface of the semiconductive substrate, an impurity region of a first conductivity type formed on a part of the surface of the second conductivity type impurity region and serving as source, and a surface portion of a second conductivity type semiconductive substrate between source and drain serving as a channel portion with a gate electrode thereon through an insulating film, so that voltage is applied to the gate electrode to control channel current between source and drain, wherein the first conductivity type semiconductive substrate comprises a low resistivity layer and a high resistivity layer epitaxially formed on the low resistivity layer, and at an interface between the low resistivity layer and the high resistivity layer is provided a convexed portion which projects at least to the high resistivity layer side.

8 Claims, 3 Drawing Sheets

VERTICAL POWER MOSFET

BACKGROUND OF THE INVENTION

1. Field of the Invention

The invention relates to a vertical power MOSFET and more particularly to a vertical power MOSFET devices which can lower on-resistance at a high power application. 2. Description of the Related Art FIG. 4 exemplifies a structure of a conventional vertical power MOSFET, a n-channel vertical power MOSFET 100 which comprises a n-type low resistivity drain substrate 101 (N+) and a high resistivity drain layer 102 (N−) formed thereon and provided with a plurality of p-type well regions 103 for forming channels and also with n-type low resistivity source regions 104 (N+ region) each formed in the respective p-type well regions 103.

The well regions 103 are spaced with each other in a fixed interval and coated on their surface with a silicon oxide film 106 except a part of each well region 103 at which the source region 104 contacts with a source electrode 107. A polysilicon gate electrode 105 extends above the silicon oxide film 106 and between adjacent well regions 103 and is coated with an insulating film 108, such as PSG (phosphorus glass).

The source electrode 107 is deposited on the insulating layer 108 by sputtering and contacts with both of the source region 104 and the well region 103 as shown. A metal drain electrode 109 is deposited at the back of the drain substrate 101 by vacuum deposition or the like.

The portion illustrated by the dotted line in FIG. 4 shows an extent of a depletion layer which is created when the an junction between source and drain in the vertical power MOSFET 100 is biased reversely.

A predetermined voltage is applied to the gate electrode 105 in the above structure for MOSFET to form a channel layer in the well regions placed beneath the gate electrode 105. When voltage is applied between the drain electrode 109 and the source electrode 107, current flows therebetween through the drain substrate 101, the drain layer 102, the channel layers and the source region 104.

The MOSFET constructed above can have a larger surface area to fetch current therethrough in comparison with a horizontal MOSFET wherein source and drain electrodes are arranged on the same surface, so that it can be used in high power applications. Also, the well regions 103 and the source regions 104 are formed in a manner of self-alignment by using the gate electrode 105 as a mask, so that density of an impurity to be doped can be controlled accurately, thereby allowing of MOSFET devices in operation to have narrow scatter and be precise.

In the conventional vertical power MOSFET 100, current flows through the portion of high resistivity drain layer 102 sandwiched between the well regions 103. Hence, there is a limit to lower resistance between source and drain when electrified (on-resistance). In detail, when resistivity of the high resistivity drain layer 102 is lowered, a larger electric field is excited at the junction with the well regions 103 to lower the breakdown voltage between source and drain electrodes, resulting in such defect that resistivity of the drain layer 102 is lowered only to some extent. Also, to increase the number of the unit cell for lowering the on-resistance should lead to an increase of required surface area of chip, creating the problems of high cost to produce and difficulty in provision of that structure.

The present invention has been designed to overcome the problems of the conventional art under the above circumstance. An object of the invention is to provide a vertical power MOSFET which solves the problems.

SUMMARY OF THE INVENTION

According to the present invention, there is provided a vertical power MOSFET which comprises a semiconductive substrate of a first conductivity type serving as drain, an impurity region of a second conductivity type on a part of the surface of the semiconductive substrate, an impurity region of a first conductivity type formed on a part of the surface of the second conductivity type impurity region and serving as source, and a surface portion of a second conductivity type semiconductive substrate between source and drain serving as a channel portion with a gate electrode thereon through an insulating film, so that voltage is applied to the gate electrode to control channel current between source and drain, wherein the first conductivity type semiconductive substrate comprises a low resistivity layer and a high resistivity layer epitaxially formed on the low resistivity layer, and at an interface between the low resistivity layer and the high resistivity layer is provided a convexed portion which projects at least to the high resistivity layer side.

The convexed portion may be rectangular in cross-section or may be tapered to some extent at the shoulders of the rectangular cross-sectional shape. Also, the convexed portion using an embedding region of the first conductivity type impurity may be shaped as convexed partially to the low resistivity layer side.

The convexed portion provided at the interface between the low resistivity layer and the high resistivity layer decreases resistance of a portion in the high resistivity layer through which current flows, thereby allowing on-resistance to be lowered.

DETAILED DESCRIPTION OF THE PREFERRED EMBODIMENTS

Examples

The present invention will now be further detailed with referring to the attached drawings The present invention should not be limited to the example described hereunder.

Figure 1:
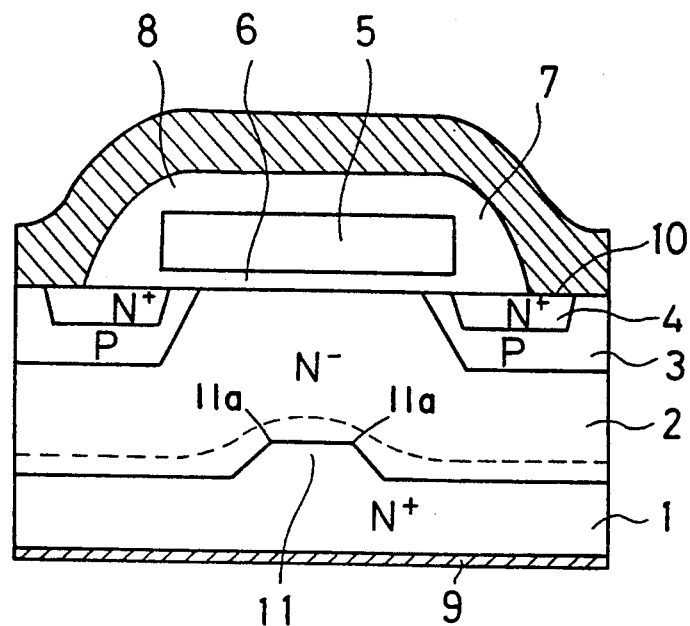
FIG. 1 is a longitudinal sectional view schematically showing a structure of an embodiment of the present invention.

FIG. 1 is a sectional view of a n-channel vertical power MOSFET of an example of the present invention. In the drawing, 1 is a N+ type of low resistivity layer and 2 is a N− type of high resistivity layer, and the layers 1 and 2 constitute a semiconductive substrate of a first conductivity type serving as drain. A plurality of p-type well regions 3 are formed in the high resistivity layer 2 to form a channel portion, and a convex portion 11 is provided at an interface between the low resistivity layer 1 and the high resistivity layer 2 just under a region sandwiched between the well regions 3.

The convex portion 11 is shown in FIG. 1 to have a an essentially rectangular cross-sectional shape for projecting toward the high resistivity layer 2. In this respect, the convex portion 11 has sides forming shoulders 11a which are seen in FIG. 1 to be tapered to some extent whereby the convex portion 11 resembles a trapezoid in cross section.

Reference number 4 refers to a n-type low resistivity source region which is formed in the respective well regions 3. The upper surfaces of the well regions 3 and source regions 4 (except their parts contacting with a conventional source electrode 7) are coated with a gate oxide film 6. A gate electrode 5 of polysilicon is arranged in a predetermined position on the gate oxide film 6 and coated with an insulating film 8. The source electrode 7 is formed on the insulating film 8. Element 9 is a drain electrode.

Figure 2A:
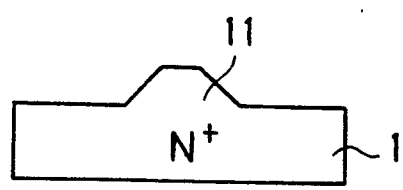
FIGS. 2(a) to (c) are schematic diagrams showing the forming process of the convexed portion in the example.

As shown in FIG. 2(a), the low resistivity layer 1 is provided by that a low resistivity n-type silicon substrate is first subjected to taper-etching (or a complete trench etching) by RIE process using, for example, $SiCl_4 + N_2$ gas and a photoresist mask to form the convex 11. The region to be in this case is set in position corresponding to a region sandwiched between the well regions 3 in FIG. 3.

Figure 2B:
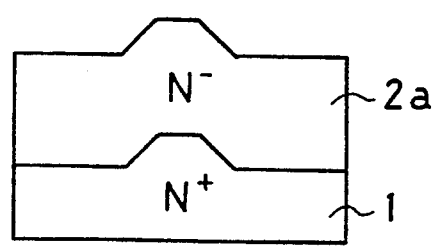
Figure 2C:
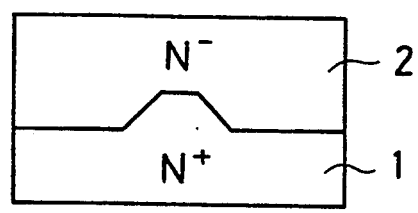
Figure 4:
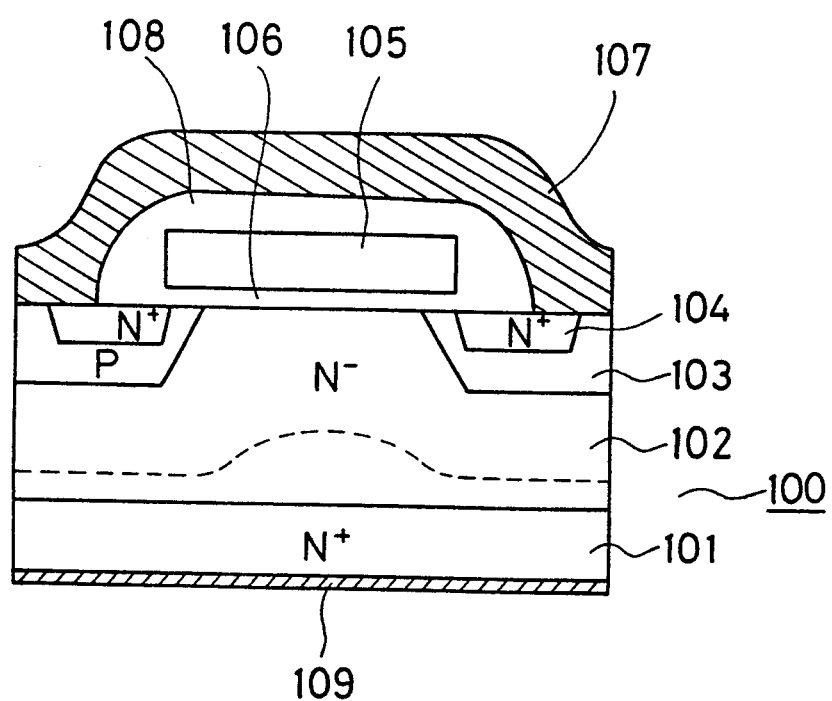
FIG. 4 is a longitudinal sectional view showing a structure of a conventional example.

Next, a high resistivity silicon layer 2a having the same conductivity type as the low resistivity layer 1 is epitaxially formed in a predetermined thickness as shown in FIG. 2(b) followed by grinding to remove a convexed portion formed on the surface of an epitaxial layer ($N^-$) corresponding to the convex 11 so as to form a uniform mirror surface as shown in FIG. 2(c), thereby providing the high resistivity layer 2. Then, the gate oxide film 6 is applied 500 to 1000Å in thickness on the mirror surface of the high resistivity layer 2 by thermal oxidation, on which polysilicon serving as the gate electrode 5 is deposited 4000 to 6000Å in thickness by low pressure CVD process, followed by continuously etching of the polysilicon and the gate oxide film 6 through RIE process using a photoresist mask.

Boron (B) is implanted to form the p-type well regions 3 and then arsenic (As) to form the source regions 4 ($N^+$) in a self-alignment manner using the polysilicon gate electrode 5 as a mask.

PSG or the like is deposited 6000Å to 1 μm in thickness on the well and source regions by CVD process to form the insulating layer 8 which is then etched to provide a contact 10 for the source electrode 7, followed by depositing Al—Si 1 μm in thickness by sputtering to form the source electrode 7. Cr—Ni—Ag or the like is deposited at the back of the low resistivity layer 1 by vacuum deposition to form the drain electrode 9 followed by final sintering of the device at 450° C. to complete the processes.

The present invention may be applicable to a p-channel vertical power MOSFET other than the n-channel vertical power MOSFET referred to in the above example.

Figure 3:
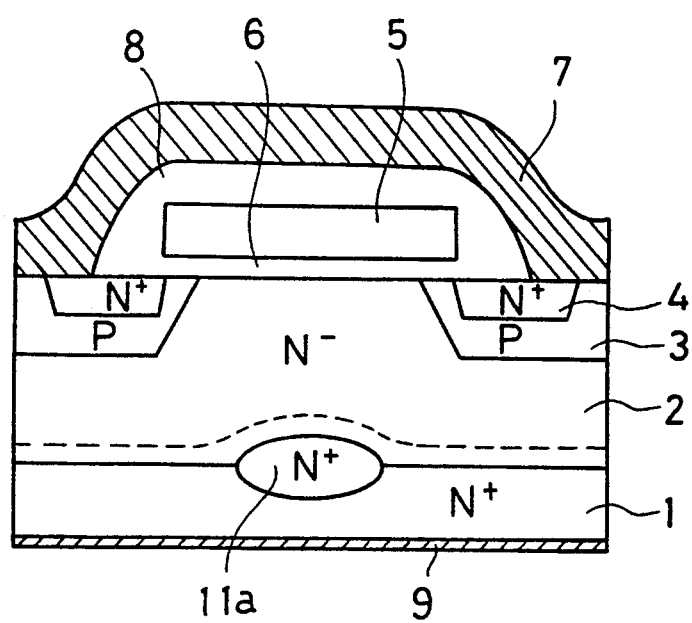
FIG. 3 is a longitudinal sectional view showing another structure of a modified embodiment of the invention.

Next, a modified embodiment of the present invention will be detailed with referring to FIG. 3.

In this example, $n^+$ type of impurity embedding region 11a serving as the convexed portion is formed at the interface between the low resistivity layer 1 and the high resistivity layer 2. The impurity embedding region 11a is convexed to both of the low and high resistivity layers side a the interface therebetween.

The impurity embedding region 11a is provided by that n-type impurity, such as phosphorous (P) is first implanted in density of more than $1 \times 10^{16} cm^{-3}$ in a region of the low resistivity layer 1 just below the gate electrode 5 by using a photoresist mask. Then, the photoresist is peeled off and the impurity embedding region 11a is washed followed by epitaxially forming the high resistivity layer 2 in a predetermined thickness (few to 100 μm). Then, the gate oxide film 6 is formed 500 to 1000Å in thickness by thermal oxidation and polysilicon is deposited thereon 4000 to 6000Å in thickness by LPCVD process to form the gate electrode 5.

The deposited polysilicon serving as the gate electrode 5 and the underlying gate oxide film 6 are patterned by dry etching with a photoresist mask followed by implanting boron (B) to form the p-type well regions 3 and arsenic (As) to form the source regions 4 by use of the gate electrode 5 as a mask.

PSG or the like is deposited 6000Å to 10000Å in thickness on the well and source regions by CVD process to form the insulating layer 8 which is then smoothed in shape by heating at 1000° C. and etched to provide a contact for the source electrode 7, followed by depositing Al—Si for wiring of the source electrode 7 by sputtering. Cr—Ni—Ag or the like is deposited at the back of the low resistivity layer 1 by vacuum deposition to form the drain electrode 9 followed by final sintering of the device at 450° C. to complete the processes.

A plurality of impurity embedding regions of $N^+$ type 11a may be provided by several times of epitaxial formation corresponding to specific predetermined thickness thereof to further lower the on-resistance. In detail, an impurity embedding region is first formed in the low resistivity layer 1. Epitaxial formation of the high resistivity layer 2 is stopped in the midst of operation and a further impurity embedding region is applied on that impurity embedding region. Then, the high resistivity layer 2 is epitaxially formed again.

It will be appreciated that the present invention may be applicable to p-channel vertical power MOSFET other than n-channel vertical power MOSFET referred to above.

The present invention provides the convexed portion in a specific region at the interface between the low resistivity layer serving as drain and the high resistivity epitaxially formed layer thereon, so that on-resistance can be lowered without deteriorating other properties. Also, devices designed as having equal on-resistance may be subminiatured in chip size to enable cost to produce to be lowered. The advantage effects on heating of devices, power consumption or the like.

What we claimed is:

1. A vertical power MOSFET which comprises a semiconductive substrate of a first conductivity type serving as a drain, an impurity region of a second conductivity type on a part of a surface of the semiconductive substrate, an impurity region of the first conductivity type formed on a part of a surface of the second conductivity type impurity region and serving as a source, and a portion of the second conductivity type impurity region between the source and the drain serving as a channel portion with a gate electrode formed thereon through an insulating film, so that voltage is applied to the gate electrode to control channel current between the source and the drain, wherein the first conductivity type semiconductive substrate comprises a low resistivity layer and a high resistivity layer epitaxially formed on the low resistivity layer, and at an interface between the low resistivity layer and the high resistivity layer is provided a convexed portion which projects at least to the high resistivity layer, the convexed portion having a cross-sectional shape of a rectangle with shoulders of the rectangle being tapered to some extent.

2. A vertical power MOSFET according to claim 1, wherein the convexed portion comprises a highly doped impurity embedding region of the first conductivity type.

3. A vertical power MOSFET according to claim 1, wherein the convexed portion is formed by etching the low resistivity layer of the substrate using an RIE method.

4. A vertical power MOSFET according to claim 1, wherein the convexed portion has an essentially trapezoidal cross-sectional shape.

5. A vertical power MOSFET which comprises a semiconductive substrate of a first conductivity type serving as a drain, an impurity region of a second conductivity type on a part of a surface of the semiconductive substrate, an impurity region of the first conductivity type formed on a part of a surface of the second conductivity type impurity region and serving as a source, and a portion of the second conductivity type impurity region between the source and the drain serving as a channel portion with a gate electrode formed thereon through an insulating film, so that voltage is applied to the gate electrode to control channel current between the source and the drain, wherein the first conductivity type semiconductive substrate comprises a low resistivity layer and a high resistivity layer epitaxially formed on the low resistivity layer, and at an interface between the low resistivity layer and the high resistivity layer is provided a convexed portion which projects at least to the high resistivity layer, wherein the low resistivity layer has a convexed portion which projects toward the high resistivity layer formed therein, the convexed portion having an essentially rectangular cross-sectional shape with sides of the convexed portion being tapered to some extent at shoulders thereof.

6. A vertical power MOSFET according to claim 5, wherein the convexed portion comprises a highly doped impurity embedding region of the first conductivity type.

7. A vertical power MOSFET according to claim 5, wherein the convexed portion is formed by etching the low resistivity layer of the substrate using an RIE method.

8. A vertical power MOSFET according to claim 5, wherein the convexed portion has an essentially trapezoidal cross-sectional shape.

* * * * *